United States Patent
Peng et al.

(10) Patent No.: US 9,236,457 B2
(45) Date of Patent: Jan. 12, 2016

(54) METHOD FOR MANUFACTURING A TFT ARRAY SUBSTRATE COMPRISING A ZINC OXIDE SEMICONDUCTOR LAYER AND AN OHMIC CONTACT LAYER

(71) Applicant: BOE TECHNOLOGY GROUP CO., LTD., Beijing (CN)

(72) Inventors: Kuanjun Peng, Beijing (CN); Jing Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/805,976

(22) Filed: Jul. 22, 2015

(65) Prior Publication Data

US 2015/0333159 A1 Nov. 19, 2015

Related U.S. Application Data

(62) Division of application No. 13/466,434, filed on May 8, 2012, now Pat. No. 9,123,819.

(30) Foreign Application Priority Data

May 9, 2011 (CN) .......................... 2011 1 0118462

(51) Int. Cl.

| G02F 1/136 | (2006.01) |
|---|---|
| G02F 1/1343 | (2006.01) |
| G02F 1/13 | (2006.01) |
| H01L 29/66 | (2006.01) |
| G02F 1/1368 | (2006.01) |
| H01L 29/786 | (2006.01) |

(Continued)

(52) U.S. Cl.
CPC ........ *H01L 29/66969* (2013.01); *G02F 1/1368* (2013.01); *H01L 21/02282* (2013.01); *H01L 29/24* (2013.01); *H01L 29/4908* (2013.01); *H01L 29/7869* (2013.01)

(58) Field of Classification Search
USPC ............................................. 349/42–48, 140
See application file for complete search history.

(56) References Cited

U.S. PATENT DOCUMENTS

| 7,674,650 B2 | 3/2010 | Akimoto et al. |
| 2006/0060855 A1* | 3/2006 | Lee ..................... H01L 27/1214 |
| | | 257/59 |

(Continued)

FOREIGN PATENT DOCUMENTS

| CN | 101000896 A | 7/2007 |
| CN | 101640219 A | 2/2010 |
| CN | 101645463 A | 2/2010 |

OTHER PUBLICATIONS

First Chinese Office Action dated Apr. 2, 2014; Appln. No. 201110118462.X.

(Continued)

*Primary Examiner* — Paul Lee
(74) *Attorney, Agent, or Firm* — Laddas & Parry LLP

(57) ABSTRACT

A method for manufacturing thin film transistor array substrate is disclosed. The method includes sequentially depositing a semiconductor layer and an ohmic contact layer on the base substrate formed with a gate insulator and patterning the semiconductor layer and the ohmic contact layer, wherein the material of the semiconductor layer is zinc oxide, and the material of the ohmic contact layer is $Ga_xZn_{1-x}O$, where $0<x\le 1$.

4 Claims, 2 Drawing Sheets

(51) Int. Cl.
*H01L 29/49* (2006.01)
*H01L 21/02* (2006.01)
*H01L 29/24* (2006.01)

(56) References Cited

U.S. PATENT DOCUMENTS

2009/0294772 A1* 12/2009 Jeong ................. H01L 27/1225 257/59
2010/0025678 A1 2/2010 Yamazaki et al.
2010/0032667 A1* 2/2010 Yamazaki ........... H01L 29/7869 257/43
2010/0096646 A1* 4/2010 Jeong ................... H01L 27/153 257/88
2011/0095285 A1* 4/2011 Shu .................... H01L 29/7869 257/43

OTHER PUBLICATIONS

USPTO NFOA dated Oct. 9, 2014 in connection with U.S. Appl. No. 13/466,434.

USPTO FOA dated Jan. 26, 2015 in connection with U.S. Appl. No. 13/466,434.

USPTO FOA mailed Apr. 28, 2014 in connection with U.S. Appl. No. 13/466,434.

* cited by examiner

METHOD FOR MANUFACTURING A TFT ARRAY SUBSTRATE COMPRISING A ZINC OXIDE SEMICONDUCTOR LAYER AND AN OHMIC CONTACT LAYER

TECHNICAL FIELD

Embodiments of the disclosed technology relate to a liquid crystal display (LCD), a thin film transistor (TFT) array substrate and a method for manufacturing the same.

BACKGROUND

Thin film transistor liquid crystal displays (TFT-LCDs) have characteristics of small volume, low power consumption and non-radiation, thus become the dominant products in the flat display market. The product performance, yield and price of TFT-LCD products are determined by the array substrate and the manufacturing process thereof. Therefore, researches in the filed have been focused on how to further improve the performance of liquid crystal display.

SUMMARY

An embodiment of the disclosed technology provides a thin film transistor array substrate, comprising: a semiconductor layer, a source electrode and a drain electrode formed adjoining the semiconductor layer, a thin film transistor channel region being defined between the source electrode and the drain electrode; and an ohmic contact layer formed between the semiconductor layer and the drain electrode and between the semiconductor layer and the source electrode, wherein the material of the semiconductor layer is zinc oxide (ZnO) and the material of the ohmic contact layer is $Ga_xZn1-xO$, where $0 \leq x \leq 1$.

Another embodiment of the disclosed technology also provides a method for manufacturing a thin film transistor array substrate, which comprises a plurality of pixel units, for each pixel unit the method comprising: forming a gate metal layer on a base substrate and forming a pattern comprising a gate electrode and a gate line by patterning the gate metal layer; forming a gate insulator on the base substrate; sequentially depositing a semiconductor layer and an ohmic contact layer on the base substrate formed with the gate insulator and patterning the semiconductor layer and the ohmic contact layer, wherein the material of the semiconductor layer is zinc oxide; depositing a source-drain metal thin film on the base substrate and forming a pattern comprising a data line, a source electrode, a drain electrode and a thin film transistor channel region by patterning the source-drain metal thin film, wherein the source electrode and the drain electrode are disposed adjoining the semiconductor layer with the interposed ohmic contact layer; forming a passivation layer on the base substrate and forming a passivation layer pattern; and depositing a transparent conductive thin film on the base substrate and forming a pixel electrode pattern by patterning the transparent conductive thin film, wherein the pixel electrode is disposed in the pixel unit defined by the gate line and the data line and is connected with the drain electrode.

Further another embodiment of the disclosed technology also provides a liquid crystal display, comprising: a color filter substrate; a thin film transistor (TFT) array substrate assembled with the color filter substrate; and a liquid crystal layer interposed between the color filter substrate and the TFT array substrate. The TFT array substrate comprises a plurality of pixel units and each pixel unit comprises: a semiconductor layer, a source electrode and a drain electrode formed adjoining the semiconductor layer, a thin film transistor channel region being defined between the source electrode and the drain electrode; and an ohmic contact layer formed between the semiconductor layer and the drain electrode and between the semiconductor layer and the source electrode, wherein the material of the semiconductor layer is zinc oxide (ZnO) and the material of the ohmic contact layer is $Ga_xZn_{1-x}O$, where $0 \leq x \leq 1$.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Hereinafter, some embodiments of the disclosed technology will be described for understanding.

Figure 1:
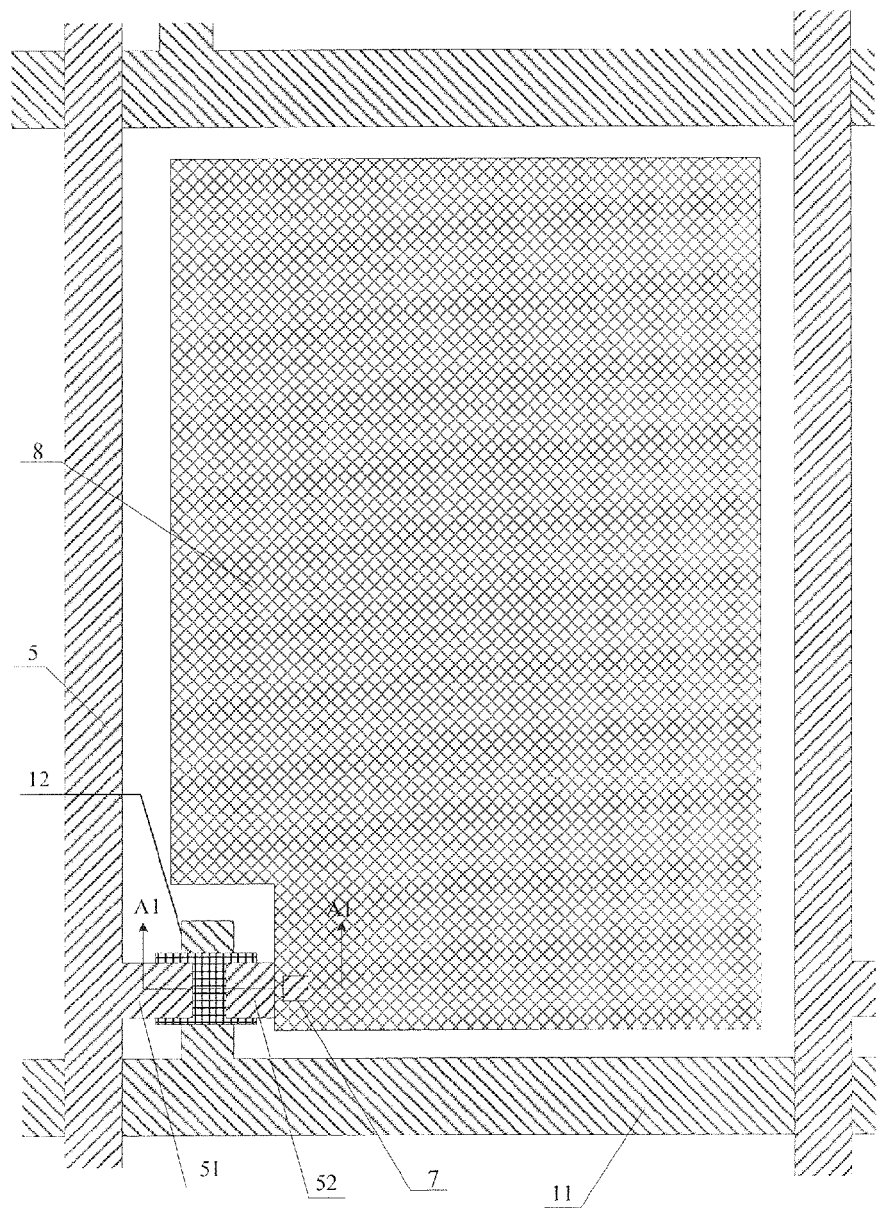
FIG. 1 is a top view of the TFT array substrate according to an embodiment of the disclosed technology.
Figure 2:
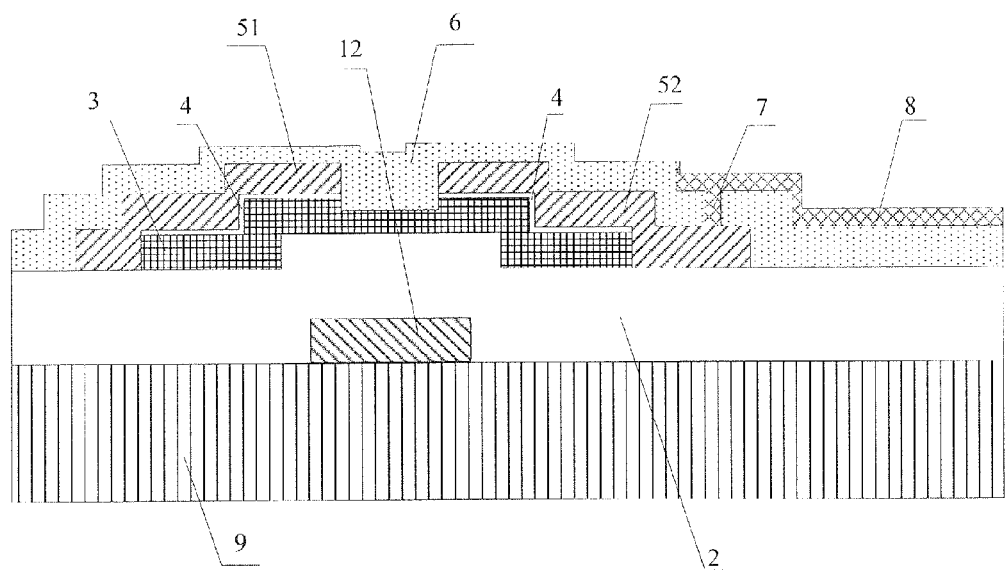
FIG. 2 is a sectional view taken along line A1-A1 of FIG. 1.

FIG. 1 is a top view of the thin film transistor (TFT) array substrate according to an embodiment of the disclosed technology, and FIG. 2 is a sectional view taken along line A1-A1 of FIG. 1. As shown in FIGS. 1 and 2, the TFT array substrate according to the present embodiment comprises a plurality of pixel units, which are defined by the intersection between a plurality of gate lines and data lines, and in the pixel units, thin film transistors (TFTs) as switching elements, which are controlled by the gate lines, and pixel electrodes connected with the TFTs for display, and more detailed each pixel unit comprises:

a transparent substrate 9;

a gate line 11 and a gate electrode 12 formed on the transparent substrate 9, wherein the gate electrode 12 is a part of or connected with the gate line 11;

a gate insulator 2 formed on the gate line 11 and the gate electrode 12 and covering the entire substrate 9;

a semiconductor layer 3 formed over the gate electrode 12 and on the gate insulator 2;

a source electrode 51, a drain electrode 52 and a data line 5 formed on the semiconductor layer 3, wherein a thin film transistor channel region is defined between the source electrode 51 and the drain electrode 52 and the data line 5 is connected with the source electrode 51;

a passivation layer 6 formed on the source electrode 51, the drain electrode 52, the exposed gate insulator 2, and the exposed semiconductor layer 3; and a pixel electrode 8 disposed in the pixel region defined by the gate line 11 and the data line 5, wherein the pixel electrode 8 is formed on the passivation layer 6 and connected with the drain electrode 52.

Here, the gate electrode 12, the gate insulator 2, the semiconductor layer 3, the source electrode 51, and the drain electrode 52 comprises a thin film transistor. The gate electrode receives the gate signals transmitted from the gate line 11 to turn on or off the thin film transistor.

The material of the semiconductor layer 3 is zinc oxide (ZnO). An ohmic contact layer 4 is formed between the semiconductor layer 3 and the drain electrode 52 and between the semiconductor layer 3 and the source electrode 51. The ohmic contact layer 4 is formed of $Ga_xZn_{1-x}O$, where $0 \leq x \leq 1$.

Preferably, a via hole 7 is formed in the passivation layer 6. The pixel electrode 8 is connected with the drain electrode 52 through the via hole 7. The transparent substrate works as a base substrate and may be a glass or plastic substrate.

In an example of the present embodiment, the material of the gate insulator 2 is poly(methylmethacrylate) (PMMA). For example, chloroformic solution in which PMMA is dissolved is spin-coated on a base substrate to form a film, and the base substrate with the coated film is dried in a vacuum oven to remove the chloroform, thus the gate insulator 2 is completed.

In an example, the gate line 11, the gate electrode 12, the source electrode 51, the drain electrode 52 and the data line 5 are made of a single-layer film of AlNd, Al, Cu, Mo or Cr and the like. In another example, the gate line 11, the gate electrode 12, the source electrode 51, the drain electrode 52 and the data line 5 may be made of a composite film of two or more layers, each layer is formed with AlNd, Al, Cu, Mo or Cr and the like, and materials of different layers may be identical or be different.

Further, the source electrode 51, the drain electrode 52 and the data line 5 may be single-layer film of Mo, MoW, or Cr and the like, or may be composite film of two or more layers and each layer is formed with Mo, MoW or Cr and the like, wherein materials of different layers may be identical or be different.

The passivation layer 6 may be a single-layer film of silicon dioxide or silicon nitride and the like, or may be a composite film of two or more layers and each layer is formed with silicon dioxide or silicon nitride and the like, wherein materials of different layers may be identical or be different.

The pixel electrode 8 is made of a transparent conductive film, such as indium tin oxide (ITO), indium zinc oxide (IZO), or the like.

It can be seen from the structure described above that the TFT array substrate of the present embodiment uses zinc oxide (ZnO) as the semiconductor layer and $Ga_xZn_{1-x}O$ as the ohmic contact layer. Compared with semiconductor layer of amorphous silicon in the conventional technology, the semiconductor layer of the present embodiment can achieve carrier mobility about 10 times higher than that of the amorphous silicon semiconductor layer. With the structure described above, the ratio of width to length of the thin film transistor channel may become smaller, thus the parasitic capacitance generated by the thin film transistor of the present embodiment can be reduced accordingly. Moreover, in the present embodiment, the aperture ratio of the pixel unit can be further improved by using thinner gate line and data line.

Another embodiment of the disclosed technology also provides a method for manufacturing the above described TFT array substrate, and for each pixel unit, comprising the following steps.

Step 31: depositing a gate metal layer on a base substrate and performing a first patterning process to form a pattern comprising a gate electrode and a gate line. The gate electrode is a part of or connected with the gate line.

A patterning process can be performed by a photolithography process and an etching process. The photolithography process may further comprises coating photoresist, exposing photoresist, and developing the exposed photoresist to form a photoresist pattern; and the etching process is performed with the formed photoresist pattern as an etching mask, and may be wet etching or dry etching.

In an example, the pattern comprising the gate electrode and the gate line can be obtained by depositing the gate metal layer on the substrate through sputtering process and performing a photolithography process and an etching process.

Step 32: forming a gate insulator on the substrate which has been treated by the first patterning process.

In an example, the gate insulator can be formed as follows: dissolving PPMA into a chloroformic solution, then spin-coating the chloroformic solution in which PMMA is dissolved on the base substrate after the first patterning process to form a film, then drying the substrate in a vacuum oven to remove the chloroform. In a conventional technology, the gate insulator is typically formed with silicon nitride, requiring a complicated process and costly equipment. For comparison, step 32 employs spin-coating process to form an insulating film, thus it has a simple process and requires relatively inexpensive equipments, and it is possible to simplify the manufacturing process and reduce the product cost.

Step 33: sequentially depositing a semiconductor layer and an ohmic contact layer on the substrate formed with the gate insulator, and forming a pattern comprising a semiconductor layer and an ohmic contact layer by a second patterning process. The pattern of the ohmic contact layer is formed above the pattern of the semiconductor layer, and the material of the semiconductor layer is zinc oxide, and the ohmic contact layer is $Ga_xZn_{1-x}O$, where $0 \leq x \leq 1$.

In an example, the semiconductor layer and the ohmic contact layer may be formed as follows: forming a ZnO thin film as the semiconductor layer and forming a $Ga_xZn_{1-x}O$ thin film as the ohmic contact layer respectively by sputtering method or chemical vapor deposition method, then performing a photolithography process and an etching process.

Step 34: depositing a source-drain metal thin film on the substrate after the second patterning process, forming a pattern comprising a data line, a source electrode, a drain electrode, and a thin film transistor channel region by a third patterning process. In an example, the source electrode and the drain electrode are disposed above the ohmic contact layer, and the data line is connected with the source electrode.

Step 35: depositing a passivation layer on the substrate after the third patterning process and forming a passivation layer pattern by a fourth patterning process.

In an example, the passivation layer is formed by chemical vapor deposition, and a via hole for connecting the later formed pixel electrode and the drain electrode is formed by a photolithography process and an etching process.

Step 36: depositing a transparent conductive metal film on the substrate after the fourth patterning process and forming a pattern of a pixel electrode by a fifth patterning process.

The pixel electrode is formed in a pixel region defined by the gate line and the data line, which are intersect with each other, and is connected with the drain electrode of the TFT of the pixel region.

In an example, the pixel electrode layer may be deposited by sputtering process and then a desired pattern of the pixel electrode is obtained by a photolithography process and an etching process. The pixel electrode is connected with the drain electrode through the via hole in the passivation layer.

With the steps described above, the present embodiment forms the TFT array substrate as shown in FIGS. 1 and 2. Moreover, in step 32, the gate insulator can be formed by spin-coating PMMA into a film. Compared with silicon nitride material used in the conventional technology, the present embodiment has advantages such as simple process and inexpensive equipment.

Lastly, the embodiments of the disclosed technology also provide a liquid crystal display, comprising: a color filter substrate; a thin film transistor (TFT) array substrate assembled with the color filter substrate; and a liquid crystal layer interposed between the color filter substrate and the TFT array substrate.

The TFT array substrate comprises a plurality of pixel units and each pixel unit comprises: a base substrate; a gate line and a gate electrode formed on the base substrate; a gate insulator formed on the gate line and the electrode and covered the entire base substrate; a semiconductor layer disposed above the gate electrode and formed on the gate insulator; a source electrode, a drain electrode and a data line formed on the semiconductor layer, a thin film transistor channel region being defined between the source electrode and the drain electrode; a passivation layer formed on the source electrode, the drain electrode, exposed gate insulator and exposed semiconductor layer; a pixel electrode disposed in a pixel region defined by the gate line and the data line, and the pixel electrode is formed on the passivation layer and connected with the drain electrode. The material of the semiconductor layer is zinc oxide, and an ohmic contact layer of $Ga_xZn_{1-x}O$, where $0 \leq x \leq 1$, is further formed between the semiconductor layer and the drain and between the semiconductor layer and the source electrode.

In the liquid crystal display of the embodiment of the disclosed technology, a via hole is formed in the passivation layer, and the pixel electrode is connected to the drain electrode through the via hole.

In the liquid crystal display of the embodiment of the disclosed technology, the material of the gate insulator is poly(methylmethacrylate), and the material of the ohmic contact layer is $Ga_xZn_{1-x}O$, wherein $0 \leq x \leq 1$.

In the embodiment as shown in FIGS. 1 and 2, a TFT of bottom gate type is illustrated for example, in which the gate insulator is formed on the gate electrode, the semiconductor layer is formed on the gate insulator, and the source and drain electrodes are formed on the semiconductor layer with an interposed ohmic contact layer. However, the disclosed technology can be used for the TFT of other types, as long as the semiconductor is formed adjoining the source and drain electrodes with an interposed ohmic contact layer. In a TFT of top gate type, the source and drain electrodes are formed on a base substrate, the semiconductor layer is formed on the source and drain electrodes with an interposed ohmic contact layer, the gate insulator is formed on the semiconductor layer, and the gate electrode is formed on the gate insulator.

Only embodiments of the disclosed technology are described above. It should be understood that those with ordinary skills in the art may make modifications without departing the principle of the disclosed technology. All such modifications are intended to be included in the scope of the disclosed technology.

What is claimed is:

1. A method for manufacturing a thin film transistor (TFT) array substrate, which comprises a plurality of pixel units, for each pixel unit the method comprising:
    forming a gate metal layer on a base substrate and forming a pattern comprising a gate electrode and a gate line by patterning the gate metal layer;
    forming a gate insulator on the base substrate;
    sequentially depositing a semiconductor layer and an ohmic contact layer on the base substrate formed with the gate insulator and patterning the semiconductor layer and the ohmic contact layer, wherein the material of the semiconductor layer is zinc oxide, and the material of the ohmic contact layer is $Ga_xZn_{1-x}O$, where $0 < x \leq 1$;
    depositing a source-drain metal thin film on the base substrate and forming a pattern comprising a data line, a source electrode, a drain electrode and a thin film transistor channel region by patterning the source-drain metal thin film, wherein the source electrode and the drain electrode are disposed adjoining the semiconductor layer with the interposed ohmic contact layer;
    forming a passivation layer on the base substrate and forming a passivation layer pattern; and
    depositing a transparent conductive thin film on the base substrate and forming a pixel electrode pattern by patterning the transparent conductive thin film, wherein the pixel electrode is disposed in the pixel unit defined by the gate line and the data line and is connected with the drain electrode.

2. The method for manufacturing the TFT array substrate according to claim 1, wherein forming the gate insulator on the base substrate comprises:
    spin-coating a chloroformic solution in which PMMA is dissolved on the base substrate to form a film; and
    drying the base substrate with the film by a vacuum baking process to remove the chloroform so as to form the gate insulator.

3. The method for manufacturing the TFT array substrate according to claim 1, wherein forming the gate insulator on the base substrate comprises:
    spin-coating a chloroformic solution in which PMMA is dissolved on the base substrate to form a film; and
    drying the base substrate with the film by a vacuum baking process to remove the chloroform so as to form the gate insulator.

4. The method for manufacturing the TFT array substrate according to claim 1, wherein forming the passivation layer pattern comprises: forming a via hole for connecting the pixel electrode and the drain electrode in the passivation layer by a photolithography process and an etching process.

* * * * *